United States Patent [19]
Maehara

[11] Patent Number: 5,375,157
[45] Date of Patent: Dec. 20, 1994

[54] X-RAY MASK STRUCTURE AND A PRODUCTION METHOD THEREOF, AN EXPOSURE METHOD USING THE X-RAY MASK STRUCTURE, AND A DEVICE FABRICATED BY USING THE X-RAY MASK STRUCTURE

[75] Inventor: Hiroshi Maehara, Yokohama, Japan
[73] Assignee: Canon Kabushiki Kaisha, Tokyo, Japan
[21] Appl. No.: 91,383
[22] Filed: Jul. 15, 1993

[30] Foreign Application Priority Data

Jul. 20, 1992 [JP] Japan .................................. 4-192199
Jun. 30, 1993 [JP] Japan .................................. 5-161953

[51] Int. Cl.⁵ .................................................. G03F 1/00
[52] U.S. Cl. .................................... 378/35; 378/34
[58] Field of Search .................. 378/34, 35; 430/5

[56] References Cited

U.S. PATENT DOCUMENTS 5,208,124  5/1993  Sporon-Fiedler et al. ............. 378/35

*Primary Examiner*—David P. Porta
*Assistant Examiner*—Don Wong
*Attorney, Agent, or Firm*—Fitzpatrick, Cella, Harper & Scinto

[57] ABSTRACT

The present invention provides an X-ray mask structure a production method thereof, and an exposure method therefor, whereby patterns can be formed faithfully to designed device line widths regardless of the thickness distribution of an X-ray transmissive membrane. The present invention also provides a device exhibiting stable and high performance fabricated by means the X-ray mask structure. In accordance with the present invention, the X-ray mask structure comprises X-ray absorbers, an X-ray transmissive membrane for supporting the X-ray absorbers, and a supporting frame for supporting the X-ray transmissive membrane, wherein the line widths of the X-ray absorbers are compensated corresponding to the thickness distribution of the X-ray transmissive membrane so that the deviation of the line widths of transferred patterns from the desired line widths of the patterns may be cancelled. A method for producing the X-ray mask structure, an exposure method using the X-ray mask structure, and a device fabricated by use of the X-ray mask structure are also disclosed.

11 Claims, 10 Drawing Sheets $w_1 > w_2 \quad I_1 > I_2$
$L_1 = L_2$
$d_1 < d_2$

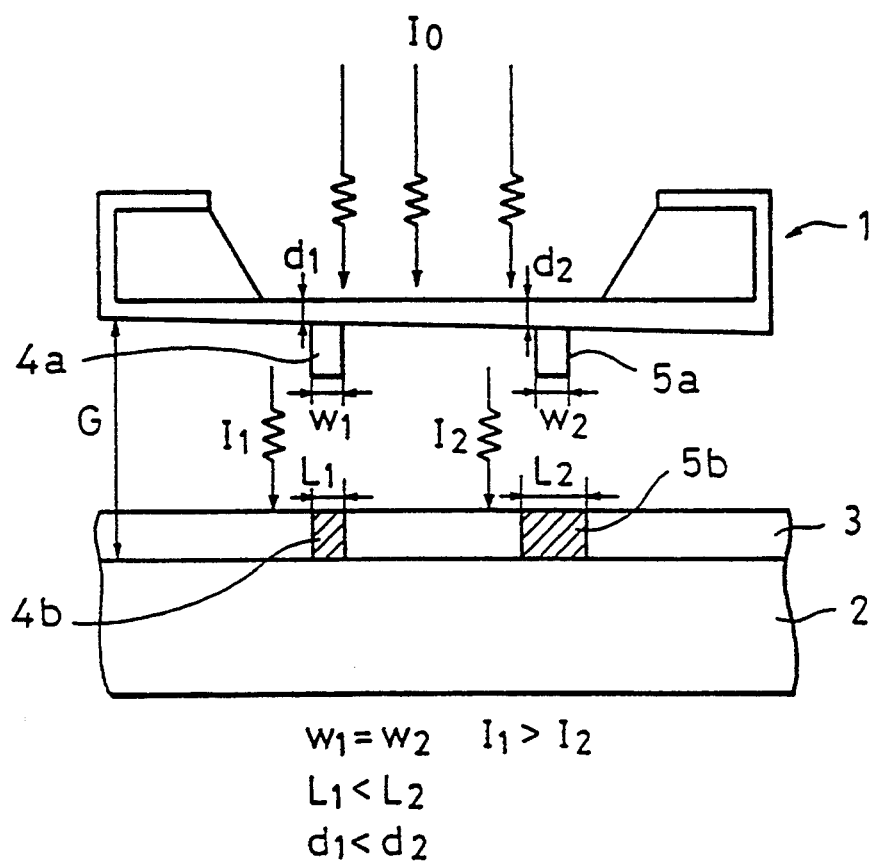

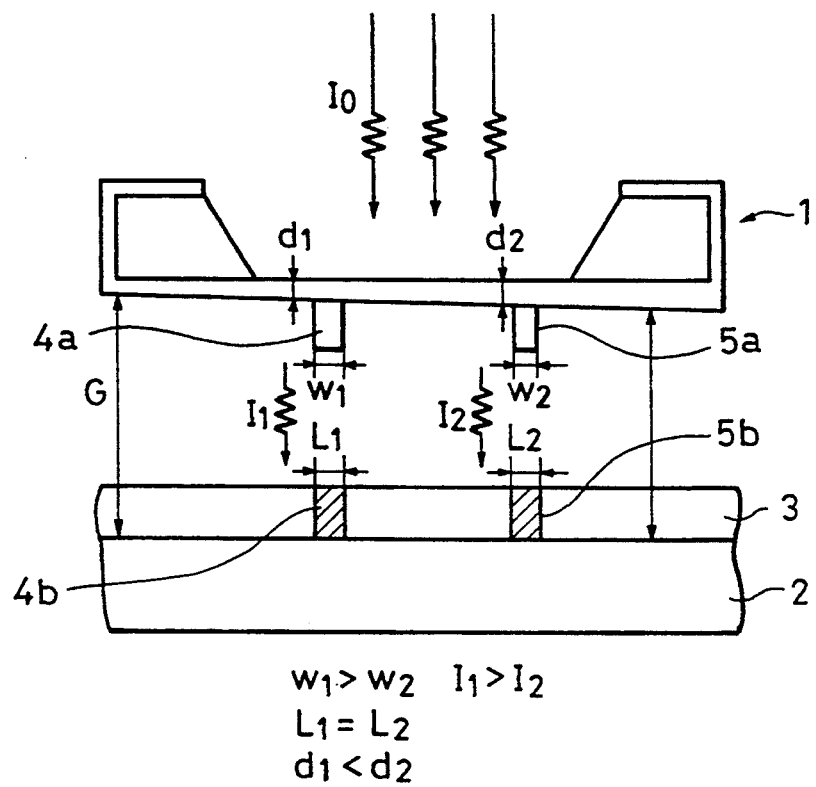

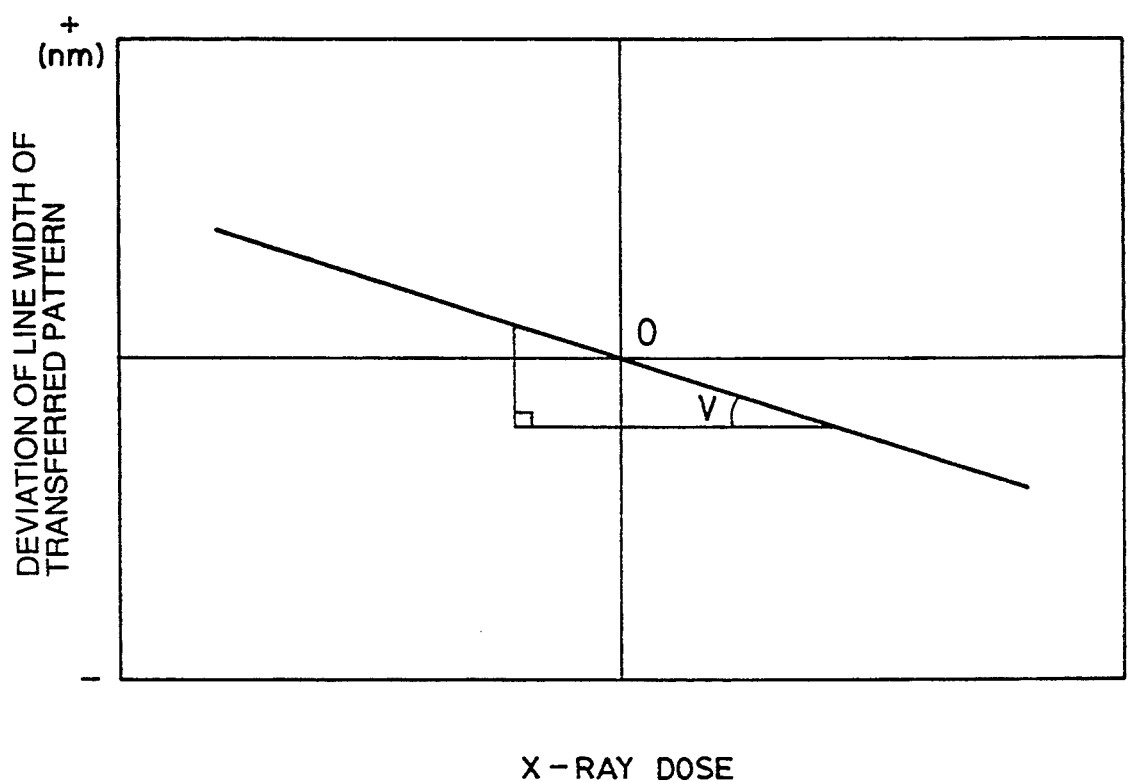

$X_1 = X_2$ , $Y_1 = Y_2$
$d_1 < d_2$
$I_1 > I_2$
$x_1 < x_2$ , $y_1 < y_2$
$x_2 - x_1 > y_2 - y_1$ $X_1 > X_2$, $Y_1 > Y_2$ $X_1 - X_2 > Y_1 - Y_2$ $d_1 < d_2$ $I_1 > I_2$ $x_1 = x_2$, $y_1 = y_2$

FLOWCHART OF SEMICONDUCTOR DEVICE PRODUCTION

WAFER PROCESS

X-RAY MASK STRUCTURE AND A PRODUCTION METHOD THEREOF, AN EXPOSURE METHOD USING THE X-RAY MASK STRUCTURE, AND A DEVICE FABRICATED BY USING THE X-RAY MASK STRUCTURE

BACKGROUND OF THE INVENTION

1. Field of the Invention

The present invention relates to an X-ray mask structure for use in lithography processes in fabrication of large scale integrated circuits (LSI) or micromachines, in which fine patterns are printed by means of X-ray exposure. The present invention also relates to a method for producing the X-ray mask structure and to an exposure method using the X-ray mask structure. Furthermore, the present invention relates to a device fabricated by using the X-ray mask structure.

2. Description of the Related Art

As a result of the very rapid advancement of the technology of very large scale integrated circuits, 4M-DRAMs are now in mass production and 16M-DRAMs or further 64M-DRAMs will be in mass production in the near future. As the technology advances, smaller feature sizes such as 0.5 μm or even 0.25 μm are required in device fabrication. In device fabrication processes, patterns on a mask structure are transferred to a semiconductor substrate by use of near ultraviolet light or deep ultraviolet light. However, the minimum feature size has already nearly reached the ultimate resolution limit that is attainable by using light of such wavelengths. Furthermore, as the device size becomes smaller, an inevitable reduction occurs in the depth of focus. In view of the above, X-ray lithography technology is generally expected to resolve all the above problems at the same time.

In general, a mask structure for use in X-ray exposure comprises patterns of an X-ray absorber formed on an X-ray transmissive membrane on a supporting frame. Among the factors required in X-ray technology using such a structure of an X-ray mask, the most important one is good uniformity in X-ray exposure intensity over an exposed area of a material such as a resist to which patterns are to be transferred. That is, the line width of the patterns transferred to the material to which the patterns are expected to be transferred varies according to the X-ray exposure intensity. When a positive resist is used as a material to which the pattern is to be transferred, the line width of transferred patterns decreases as the intensity of exposing X-rays increases. In contrast, when a negative resist is used, the line width of transferred patterns increases as the intensity of exposing X-rays increases. The variation in intensity of exposing X-rays occurs according to the variation in the thickness of the X-ray transmissive membrane in a fashion as described by the following equation (1):

$$I = Io \cdot exp(-\mu \cdot dm) \quad (1)$$

where I is the intensity of the X-rays after transmitting through the X-ray transmissive membrane, Io is the intensity of incident X-rays, μ is the linear absorption coefficient of the X-ray transmissive membrane with respect to the exposing X-rays, and dm is the thickness of the X-ray transmissive membrane.

A conventional X-ray mask structure is not necessarily uniform in thickness of its X-ray transmissive membrane, but there exists a thickness distribution. Therefore, for the reason described above, nonuniformity occurs in the intensity of the X-ray exposure across the area to be exposed at the material to which the pattern is to be transferred. Thus, a very serious problem occurs in that because the designed device line width (that is, the desired line width to be transferred) cannot be reproduced with high fidelity, the high potential abilities of X-ray lithography described above cannot be effectively used to achieve the high integration of devices.

SUMMARY OF THE INVENTION

In view of the above, it is an object of the present invention to provide an X-ray mask structure, a method for producing it, and an exposure method, whereby the designed device line width can be transferred faithfully regardless of such thickness nonuniformity.

It is another object of the present invention to provide a large scale integrated device exhibiting stable and high performance, which is fabricated by using the above X-ray mask structure.

The above objects can be achieved by the present invention described herein below. That is, the present invention provides an X-ray mask structure comprising an X-ray absorber, an X-ray transmissive membrane for supporting the X-ray absorber, and a supporting frame for supporting the X-ray transmissive membrane, wherein the line width of the X-ray absorber pattern is compensated corresponding to the distribution of the thickness of the X-ray transmissive membrane so as to cancel the deviation of the transferred line width from the desired line width.

The present invention further provides an X-ray exposure method for transferring the X-ray absorber pattern to a material to which patterns are expected to be transferred by performing the exposure through the above X-ray mask structure.

Furthermore, the present invention provides a device fabricated by transferring the X-ray absorber pattern to a substrate to be fabricated, by means of exposure through the above X-ray mask structure, and further by performing other required processing so as to form a complete device.

The present invention still further provides a method for producing an X-ray mask structure comprising an X-ray absorber, an X-ray transmissive membrane for supporting the X-ray absorber, and a supporting frame for supporting the X-ray transmissive membrane, wherein the method comprises the steps of:

(a) measuring the thickness distribution of the X-ray transmissive membrane; and (b) according to the resultant measured data of the thickness distribution, performing compensation on the line width of the X-ray absorber so as to cancel the difference between the transferred pattern line width and the required line width.

The present invention further provides a method for producing an X-ray mask structure comprising an X-ray absorber, an X-ray transmissive membrane for supporting the X-ray absorber, and a supporting frame for supporting the X-ray transmissive membrane, wherein the method comprises the steps of:

(a) measuring the thickness distribution of the X-ray transmissive membrane;

(b) measuring the line width of a transferred pattern corresponding to the line width variation of the X-ray absorber; and (c) according to the resultant measured data obtained in the previous steps (a) and (b), performing compensation on the line width of the X-ray absorber so as to cancel the difference between the transferred pattern line width and the required line width.

BRIEF DESCRIPTION OF THE DRAWINGS

FIG. 2 illustrates schematically the pattern transfer performed by a conventional X-ray mask structure;

FIG. 3 illustrates schematically the pattern transfer performed by an X-ray mask structure in accordance with the present invention;

FIG. 4 is a graph showing the relationship between the X-ray dose and the change of the line width of the transferred pattern;

DESCRIPTION OF THE PREFERRED EMBODIMENTS

Figure 1A:
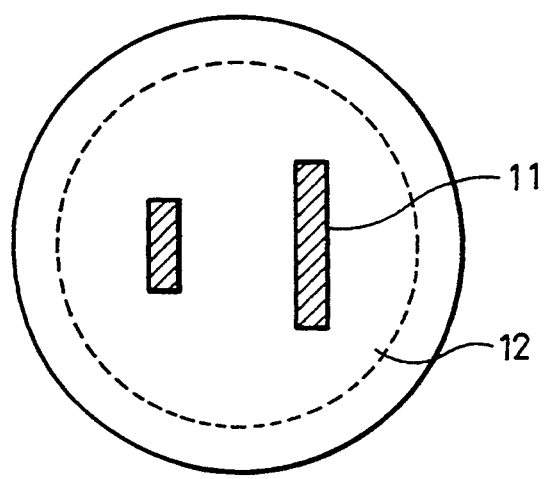
FIGS. 1(a) and 1(b) illustrate schematically the structure of an X-ray mask structure in accordance with the present invention.

FIG. 2 illustrates schematically the pattern transfer performed by a conventional X-ray mask structure and by an X-ray mask structure in accordance with the present invention. In this figure, exposing X-ray Io is incident at a right angle upon the X-ray mask structures 1 (whose cross sections is shown in the figure), and supplied to a material 3 (whose cross section is shown in the figure) to which a pattern is to be transferred, wherein the material is coated on a substrate 2 such as a silicon wafer arranged at a predetermined distance G from the X-ray mask structures 1.

Referring to FIG. 2, in the conventional X-ray mask structure, while the X-ray absorber patterns 4a and 5a are formed in such a way that both patterns are the same in line width ($W_1 = W_2$), a difference occurs between the line widths $L_1$ and $L_2$ ($L_2 > L_1$) of the patterns 4b and 5b transferred from each X-ray absorber pattern due to the difference between the X-ray intensities $I_1$ and $I_2$ ($I_1 > I_2$) at the material 3 to which the patterns are to be transferred wherein the X-ray intensity difference results from the thickness distribution of the X-ray transmissive membrane ($d_2 > d_1$). This means that even if the X-ray absorber patterns 4a and 5a are formed in such a manner that their line widths are the same as the designed line widths (desired line widths) which are expected to be transferred to the substrate 2, it is impossible to form patterns on the substrate 2 faithfully to the designed pattern line widths.

In contrast, in the X-ray mask structure in accordance with the present invention, as shown in FIG. 3, when the line width $L_1$ of the pattern 4b transferred from the X-ray absorber pattern 4a is equal to the designed line width (desired pattern line width) wherein the X-ray absorber pattern 4a is located on the part of the X-ray transmissive membrane having the least thickness among those parts of the X-ray transmissive membrane on which X-ray absorber patterns are formed, the line width $W_2$ of another X-ray absorber pattern 5a is compensated ($W_1 > W_2$) corresponding to the difference in thickness across the X-ray transmissive membrane ($d_2 > d_1$) so that the difference of the transferred line width $L_2$ from the desired line width $L_1$ can be cancelled. Thus, it is possible to form patterns faithful to the designed pattern line widths ($L_1 = L_2$) on the substrate 2.

Preferred Aspects of the Invention

Figure 1B:
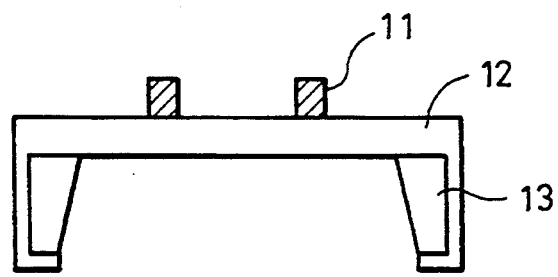

For further detailed illustration, preferred aspects of the present invention will be described herein below.

in accordance with the present invention, as shown in FIG. 1A (plan view) and FIG. 1B (cross-sectional view), an X-ray mask structure comprises an X-ray absorber 11, an X-ray transmissive membrane 12 for supporting the X-ray absorber 11, and a supporting frame 13 for supporting the X-ray transmissive membrane 12, wherein the line width of the X-ray absorber 11 is compensated corresponding to the distribution in the thickness of the X-ray transmissive membrane 12 so as to cancel the deviation of the transferred line width from the desired line width. A "transferred line width" herein refers to a line width of a pattern actually obtained in a material such as a resist to which the pattern is to be transferred, or a line width of a pattern actually formed by X-ray lithography on a substrate such as silicon. A "desired line width of a pattern" refers to a designed line width of a pattern which should be achieved in a device to be fabricated. The X-ray exposure condition is preferably determined so that the line width of the pattern formed on the part of the X-ray transmissive membrane having the least thickness among those parts of the the X-ray transmissive membrane on which X-ray absorber patterns are formed is equal to the desired line width of the pattern. This is because the X-ray intensity applied to a material to which the pattern is to be transferred increases as the thickness of X-ray transmissive membrane decreases.

Furthermore, in an X-ray mask structure in accordance with the present invention, the correction amount (B) of the line width of the X-ray absorber preferably has the relationship described by the following equation (I):

$$|B| = |V \cdot exp(\mu \cdot \Delta dm)| \quad (1)$$

where $\mu$(cm$^{-1}$) is the linear absorption coefficient of the X-ray transmissive membrane with respect to the exposing X-rays, $\Delta dm$ (nm) is the deviation of the thickness of the X-ray transmissive membrane, and V (nm) is the change in the transferred line width for the change of unit X-ray dose.

That is, if the thickness of the X-ray transmissive membrane changes from $dm_1$ to $dm_2$ ($\Delta dm$) in equation (I), then the change ($\Delta I$) in the X-ray dose is given by the following equation (2):

$$\Delta I = I_2/I_1 = exp(-\mu \cdot \Delta dm) \quad (2)$$

where $I_1$ is the X-ray intensity after transmitting through the X-ray transmissive membrane having a thickness of $dm_1$ and $I_2$ is the X-ray intensity after transmitting through the X-ray transmissive membrane having a thickness of $dm_2$.

In the range of adequate X-ray dose, the change in the transferred line width is proportional to the change in the X-ray dose as shown in FIG. 4. Thus, if the slope of this graph (the change in the transferred line width due to the change of unit X-ray dose) is referred to as V, then the correction amount B of the line width of the X-ray absorber with respect to the desired line width (designed line width) is given by the following equation (I-a) for the case of a positive resist:

$$Bp = V \cdot exp(\mu \cdot \Delta dm) \quad \text{(I-a)}$$

and given by the following equation (I-b) for the case of a negative resist:

$$Bn = -V \cdot exp(\mu \cdot \Delta dm) \quad \text{(I-b)}$$

As a result, the following equation is obtained:

$$|B| = |V \cdot exp(\mu \cdot \Delta dm)| \quad \text{(I)}$$

In the above equation (I), the coefficient V referring to the change in the transferred line width due to the change of unit X-ray dose is dependent on the type and/or characteristics of the resist and other conditions, however, a preferable value is in the range from $-100$ to $+100$.

Hereinbelow will be described another preferred aspect of an X-ray mask structure in accordance with the present invention.

That is, in this preferred aspect of the present invention, not only is the line width of the X-ray absorber compensated as described above corresponding to the distribution of the thickness of the X-ray transmissive membrane so as to cancel the deviation of the transferred line width from the desired line width, but also the line width of the X-ray absorber is compensated corresponding to the variation of the line width so as to cancel the deviation of the transferred line width from the desired line width.

Figure 5:
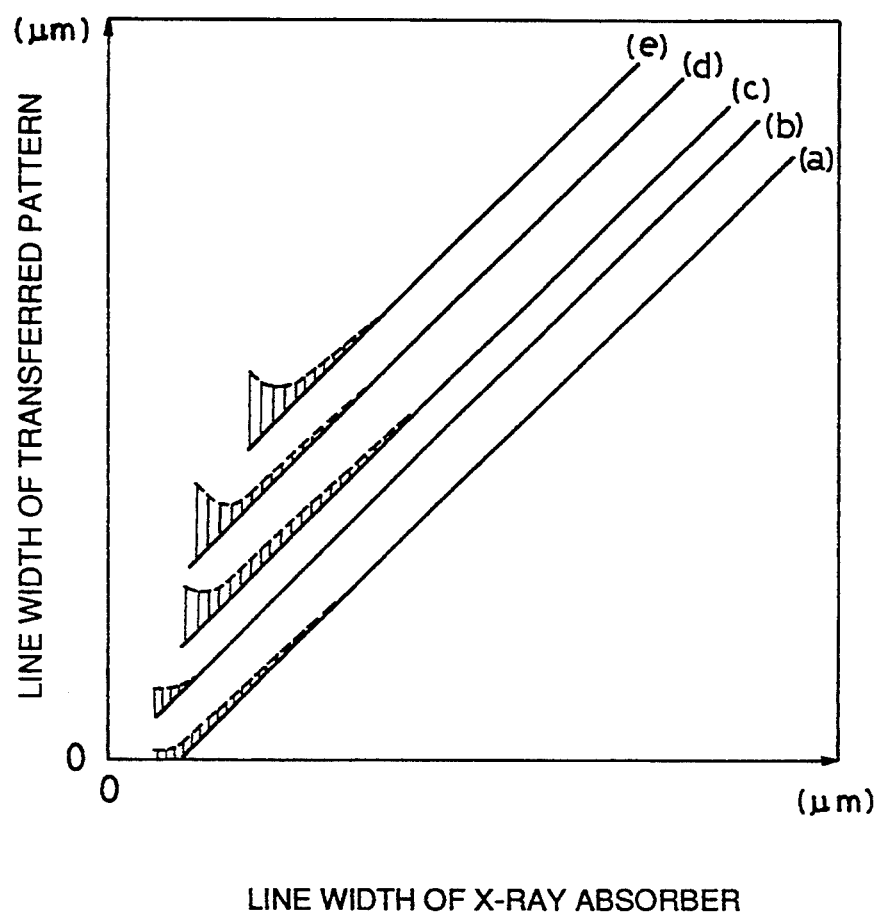
FIG. 5 is a graph showing the fidelity of the line width of resist patterns transferred by the X-ray exposure, with respect to the line width of X-ray absorber patterns.
Figure 6:
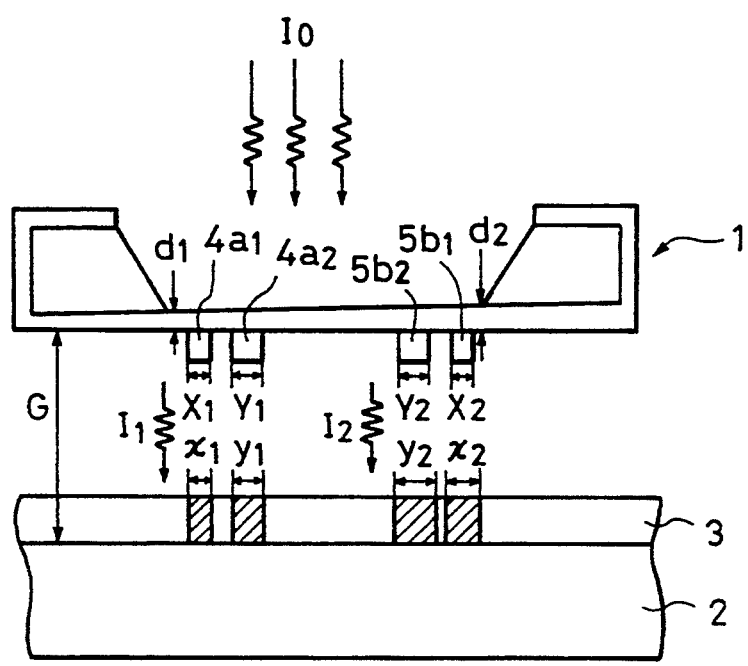
FIG. 6 illustrates schematically the pattern transfer performed by a conventional X-ray mask structure.
Figure 7:
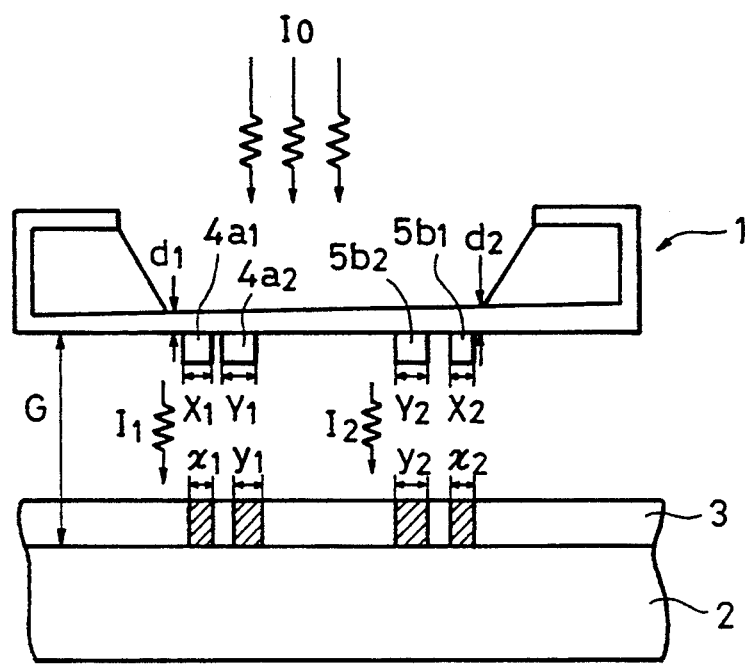
FIG. 7 illustrates schematically the pattern transfer performed by an X-ray mask structure in accordance with another aspect of the present invention.

As described earlier, the deviation of the transferred line width from the desired line width occurs depending on the intensity of the X-ray exposure at the material to which the pattern is to be transferred. More specifically, the change in the line width of the transferred pattern can be considered to have a substantially linear relationship to the change (variation) in the line width of the X-ray absorber as shown in FIG. 5. In this figure, various lines (a)-(e) correspond to various intensities of the X-ray exposure. However, in a more rigorous sense, in the range for less line widths, the transferred line width shows a nonlinear relationship to the line width of the X-ray absorber as shown in the hatched areas in FIG. 5. Referring to FIGS. 6 and 7, the nonlinear relationship will be explained in more detail. In these figures, exposing X-ray Io is incident at a right angle upon the X-ray mask structure 1, and applied to a material 3 to which a pattern is to be transferred, wherein the material is coated on a substrate 2 such as a silicon wafer arranged at a predetermined distance G from the X-ray mask structure 1. In a conventional X-ray mask structure, as shown in FIG. 6, while the X-ray absorber patterns $4a_1$, $4a_2$, $5b_1$, and $5b_2$ are formed in such a way that the patterns $4a_1$ and $5b_2$, are the same in line width as well as the patterns $4a_2$ and $5b_2$ are the same in line width ($X_1 = X_2$, $Y_1 = Y_2$), a difference occurs between the line widths $x_1$ and $x_2$ ($x_1 < x_2$) and between $y_1$ and $y_2$ ($y_1 < y_2$) of the patterns transferred from each X-ray absorber pattern, because of the difference between the X-ray intensities ($I_1 > I_2$) resulting from the thickness distribution of the X-ray transmissive membrane ($d_2 > d_1$), as described earlier. Furthermore, in a more rigorous sense, the deviation of the line width from the designed value is dependent not only on the difference in the X-ray intensity, but also on the difference in the line width of the absorber ($x_2 - x_1 > y_2 - y_1$).

In contrast, in the preferred embodiment of an X-ray mask structure in accordance with the present invention, as shown in FIG. 7, when the line width of the pattern transferred from the X-ray absorber pattern is equal to the designed line width (desired pattern line width) wherein this X-ray absorber pattern is located on the part of the X-ray transmissive membrane having the least thickness among those parts of the X-ray transmissive membrane on which X-ray absorber patterns are formed, the line widths of other X-ray absorber patterns are compensated corresponding to both the thickness distribution of the X-ray transmissive membrane ($d_2 > d_1$) and the line width variation of X-ray absorbers (between $X_1$ and $Y_1$ or between $X_2$ and $Y_2$) in such a way that the compensation is performed according to the following equation (II):

$$|B| = |V \cdot exp(\mu \cdot \Delta dm) + \Delta x| \quad \text{(II)}$$

where $\mu (cm^{-1})$ is the linear absorption coefficient of the X-ray transmissive membrane with respect to the exposing X-rays, $\Delta dm$ (cm) is the deviation of the thickness of the X-ray transmissive membrane, V (nm) is the change in the transferred line width for the change of unit X-ray dose, and $\Delta x$ (nm) is the deviation of the line width of the transferred patterns occurring depending on the variation of the line width of the X-ray absorber.

$\Delta x$ corresponds to the hatched regions in FIG. 5, and the value of $\Delta x$ can be obtained from a graph plotted in a similar manner to that of FIG. 5. The preferable value of V in equation (II) is in the range from $-100$ to $+100$.

Other members included in the X-ray mask structure in accordance with the present invention will be described in more detail hereinbelow. The thickness of an X-ray transmissive membrane is preferably in the range from 1 $\mu m$ to 10 $\mu m$ so that the deviation of the transferred line width from the designed line width can be minimized. The X-ray transmissive membrane can be made of a known material including an inorganic film such as Si, $SiO_2$, SiC, SiN, SiCN, BN, and BNC and an organic film exhibiting radiation hardness such as polyimide.

The X-ray absorber for absorbing X-rays may be made of a heavy metal material such as Au, W, Ta, and Pt or a compound of these elements having a thickness in the range from 0.1 $\mu m$ to 5 $\mu m$.

The supporting frame for supporting the X-ray transmissive membrane may be made from, for example, a silicon wafer. The supporting frame may be provided with a holder portion for convenience in transferring of a mask structure substance. The holder portion may be made of a material such as heat-resistant glass (known by the trade name "pyrex"), Ti, Fe-Co alloy, and ceramics.

The X-ray mask structure in accordance with the present invention may be further provided with a protection film for the X-ray absorber, and/or conductive film, and/or anti-reflection film to alignment light, and/or other functional films.

In accordance with the present invention, an X-ray exposure method and a device use advantageously an X-ray mask having such a structure described above. That is, in the X-ray exposure method in accordance with the present invention, a material to which a pattern is to be transferred is exposed to X-ray radiation through the X-ray mask structure described above so as to transfer the pattern from the X-ray absorber to the material to which the pattern is expected to be transferred.

In accordance with the present invention, a device is produced by transferring a pattern of the X-ray absorber to a substrate to be fabricated by use of X-ray exposure through the X-ray mask structure, and further by performing other necessary fabrication processes. The X-ray exposure method in accordance with the present invention is the same as a conventional method except that the X-ray mask structure in accordance with the present invention is used, and the device in accordance with the present invention is the same as a conventional one except that the X-ray mask structure in accordance with the present invention is used.

Now, in accordance with the present invention, a method for producing an X-ray mask structure will be described hereinbelow.

In accordance with the present invention, a method for producing an X-ray mask structure comprises the steps of: (a) measuring the thickness distribution of the X-ray transmissive membrane; and (b) based on the resultant measurement data of the thickness distribution, compensating the line widths of the X-ray absorbers so that the deviations of the line widths of the transferred patterns from the desired line widths may be cancelled.

That is, in the above step (a), the thickness distribution the X-ray transmissive membrane is measured across the X-ray mask structure in the form in which the X-ray absorber has not been formed yet (that is, an X-ray mask blank) so as to obtain accurate data.

In step (b), then, (1) a resist (a material to which the pattern is to be transferred) to be used in the actual processes is test-exposed to the X-ray radiation through a testing X-ray mask structure so as to measure the changes in the line widths of transferred patterns as a function of the X-ray dose; and (2) based on the data on the thickness distribution obtained in step (a) and based on the data on the changes of transferred line widths obtained in the above substep (1), the compensation values B are determined from equation (I) discussed above for each part of the surface of the X-ray transmissive membrane; whereby patterns of the X-ray absorber are formed on the X-ray transmissive membrane according to the above determined data.

In accordance with the present invention, another method for producing an X-ray mask structure comprises the steps of: (a) measuring the thickness distribution of the X-ray transmissive membrane; (b) measuring the transferred line widths corresponding to variations of the line width of the X-ray absorber; and based on the resultant measurement data obtained in steps (a) and (b), compensating the line widths of the X-ray absorbers so that the deviations of the line widths of the transferred patterns from the desired line widths may be cancelled.

That is, in the above step (a), the thickness distribution of the X-ray transmissive membrane is measured across the X-ray mask structure in the form in which the X-ray absorber has not been formed yet (that is, an X-ray mask blank) so as to obtain accurate data.

In step (b), then, (1) a resist (a material to which the pattern is to be transferred) to be used in the actual processes is test-exposed to the X-ray radiation through a testing X-ray mask structure so as to measure the changes in the line widths of transferred patterns as a function of the X-ray dose, and also so as to measure the changes in the line widths of transferred patterns with respect to the line width variation of the X-ray absorbers.

Furthermore, in step (c), based on the data on the thickness distribution obtained in step (a) and based on the data on the changes of transferred line widths obtained in (b), the compensation values B are determined from equation (II) discussed above for each part of the surface of the X-ray transmissive membrane; whereby patterns of the X-ray absorber are formed on the X-ray transmissive membrane according to the above determined data.

In the above methods for producing an X-ray mask structure, the fabrication processes other than those described above, such as methods for forming the X-ray transmissive membrane and the X-ray absorber and methods for forming the supporting frame, are the same as conventional known methods.

Now, the advantages of the present invention will be described.

As described above, the present invention provides an X-ray mask structure, production method thereof, and X-ray exposure method, whereby even if there is some thickness distribution in an X-ray transmissive membrane, pattern line widths faithful to the designed line widths can be achieved regardless of such a thickness distribution. Furthermore, the present invention provides a large scale integrated device having stable and high performance resulting from the advantages of the above X-ray mask structure used for fabrication.

Now, specific examples of embodiments will be described hereinbelow.

Embodiment 1

(1) Measurement of the thickness distribution of an X-ray transmissive membrane:

Prior to conversion from designed mask data to pattern data, the thickness distribution of the X-ray transmissive membrane was accurately determined across an X-ray mask blank to be used as a mask structure substrate. In this case, SiN was used for the X-ray transmissive membrane. The thickness of this membrane was measured by using an optical film thickness measurement tool TM-005 (available from Canon Inc.)

(2) The change of the transferred line widths as a function of the X-ray dose:

RAY-PF (available from Hoechst) was prepared as a resist (material to which the patterns are to be transferred) to be used in the actual X-ray exposure processes. The data representing the dependence of the X-ray dose on the resist pattern line width (transferred line width) was obtained as shown in FIG. 4 by using a testing X-ray mask structure. The line widths of the resist patterns were measured by using an EB line width measurement tool. As a result of the measurement, −74 nm was obtained as the value of V.

(3) Compensation of line widths with respect to designed values:

Based on the result obtained in (1), the line width was designed as 0.25 μm for the X-ray absorber pattern to be formed on the part of the X-ray transmissive membrane having a thickness of 2 μm. On the other hand, based on the calculation which will be shown later, the line width was designed as 0.171 μm for the X-ray absorber pattern to be formed on the part of the X-ray transmissive membrane having a thickness of 2.2 μm.

In the above determination, a calculation was carried out by using the values: $V=-74$ nm, $\Delta dm=2\times10^{-5}$ cm, and $\mu=3465$ cm$^{-1}$. Thus, $Bp=-79$ nm was obtained from equation (I-a). Then, the line width of the X-ray absorber was determined as $250-79=171$ nm$=0.171$ μm.

(4) production of an X-ray mask structure:

An X-ray mask structure was produced in accordance with the present invention as described below. First, a 25×25 mm$^2$ area of SiN on the back surface of the X-ray mask blank prepared in (1) was removed by means of dry etching in SF$_6$ gas at an RF-power of 200 W, at a pressure of 4 Pa, and at a gas flow rate of 20 sccm. Then, Si was back-etched in an aqueous solution of 25%-potassium hydroxide at 110° C. for 7 hours. After that, 5 nm-thick chromium and 50 nm-thick gold were successively deposited on the surface of the substrate by means of electron beam evaporation so as to form an electrode for plating. On this electrode, 1 μm-thick PMMA to be used as an electron beam resist was spin-coated, then based on the design of the compensated value determined in (3), electron beam exposure was carried out. After the resist was developed, using the resultant resist patterns as a template, gold-plating was performed in a sulfurous-acid-based plating solution NEWTRONEX 309 (available from EEJA) at 50° C. After the plating, the resist and gold electrode were removed by means of O$_2$ RIE and Ar sputtering, respectively. Then, the remaining Cr was oxidized by means of O$_2$ RIE so as to alter it to a transparent material for visible light. Finally, this mask structure substrate was bonded to a supporting frame of pyrex (trade name) to obtain a complete X-ray mask structure in accordance with the present invention for a positive type resist RAY-RF.

Embodiment 2

Instead of the positive X-ray resist RAY-PF in (2) of Embodiment 1, a negative X-ray resist RAY-PN (Hoechst) was used. In a similar manner to that of Embodiment 1, the value of V was obtained as 32 nm.

In a similar manner as in (3) of Embodiment 1, the line width was designed as 0.25 μm for the X-ray absorber pattern to be formed on the part of the X-ray transmissive membrane having a thickness of 2 μm. On the other hand, based on the calculation which will be shown later, the line width was designed as 0.284 μm for the X-ray absorber pattern to be formed on the part of the X-ray transmissive membrane having a thickness of 2.2 μm.

In the above design, a calculation was carried out by using the values: $V=32$ nm, $\Delta dm=2\times10^{-5}$ cm, and $\mu=3465$ cm$^{-1}$. Thus, $Bn=34$ nm was obtained from equation (I-b). Then, the line width of the X-ray absorber was determined as $250+34=284$ nm ($=0.284$ μm).

The other processes were carried out in the same manner as in the case of Embodiment 1 to obtain a complete X-ray mask structure in accordance with the present invention for a negative resist RAY-PN.

Embodiment 3

Figure 8:
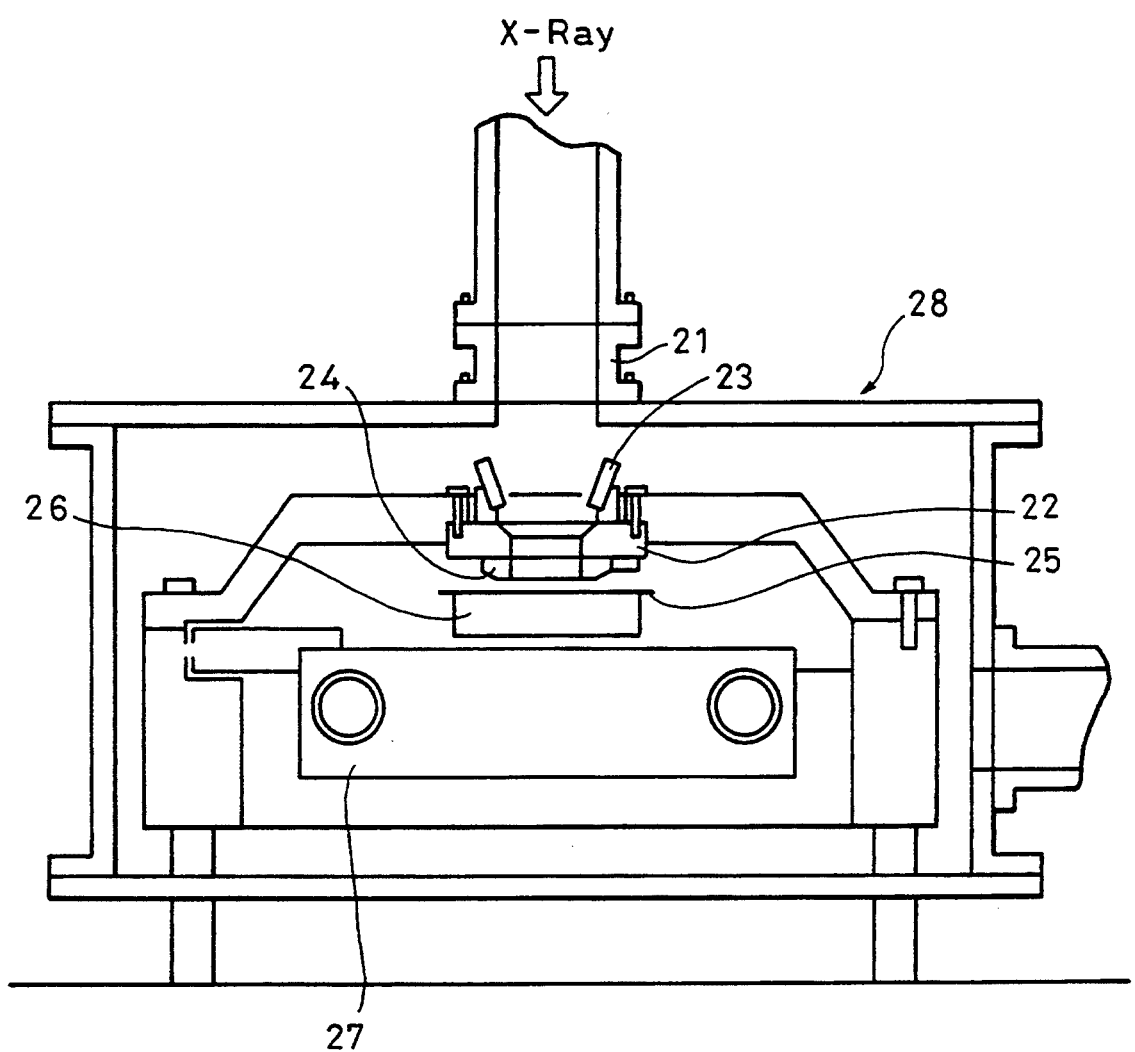
FIG. 8 shows schematically the structure of an X-ray exposure apparatus.

Using the X-ray mask structure of Embodiment 1, patterns were transformed to the surface of a silicon wafer with an X-ray exposure tool shown in FIG. 8. For convenience, the X-ray exposure tool will be described briefly below. As shown in FIG. 8, this X-ray exposure tool comprises an exposure chamber 28, an X-ray mask structure holder 22 (stage), a wafer stage 27, an X-ray mask structure 24, and a positioner 23 for positioning a wafer 25. The exposure chamber 28 is isolated from an X-ray generator by a barrier of Be or diamond. The exposure chamber 28 controls the exposure environment such as a gas atmosphere and pressure. The X-ray mask structure 24 and the wafer 25 are arranged in such a manner that they are a few microns to a few ten microns apart from each other. After an exposure is finished, the relative position between the X-ray mask structure 24 and the wafer 25 is shifted in the lateral direction, then another portion of the wafer 25 is exposed. This process is successively repeated (that is, step-and-repeated). The position of the wafer 25 with respect to the X-ray mask structure 24 in the lateral direction is adjusted by means of the positioner 23. The X-ray generator and exposure controller are not shown in the figure for simplicity. The wafer was spin-coated with 1.5 μm-thick positive X-ray resist RAY-PF, then was pre-baked at 110° C. for 60 sec. After exposure was carried out, PEB was performed for the resist at 75° C. for 3 min, then the resist was developed in AZ-312 MIF (diluted 2.5 times with pure water) for 60 sec.

Then, the line widths of the resulting patterns formed in the resist were measured by using a line-width-measurement scanning electron microscope (SEM) and the measured values were compared to the designed device line widths. Each measured value corresponding to each point of Embodiment 1 was 0.25 μm, which implies that excellent coincidence with the designed value was achieved without any influence of the thickness variation of the X-ray transmissive membrane of the X-ray mask structure.

Embodiment 4

Using the X-ray mask structure of Embodiment 2, patterns were transformed to the surface of a silicon wafer by means of X-ray exposure. In this embodiment, the wafer was spin-coated with a 1.5 μm-thick negative X-ray resist RAY-PN, then was pre-baked at 20° C. for 120 sec. After exposure was carried out, PEB was performed for the resist at 105° C. for 3 min, then the resist was developed in AZ-312 MIF (diluted 3 times with pure water for 60 sec.

Then, the line widths of the resulting patterns formed in the resist were measured by using a line-width-measurement SEM and the measured values were compared to the designed device line widths. Each measured value corresponding to each point of Embodiment 2 was 0.25 μm, which implies that excellent coincidence with the designed value was achieved without any influence of the thickness variation of the X-ray transmissive membrane of the X-ray mask structure.

Embodiment 5

In a similar manner to that in "(1) measurement of the thickness distribution of an X-ray transmissive membrane" of Embodiment 1, prior to conversion from designed mask data to pattern data, the thickness distribution of the X-ray transmissive membrane was accurately determined across an X-ray mask blank to be used as a mask structure substrate. In the case of the substrate used in this embodiment, there was observed an approximately concentric distribution in the thickness of SiN used as the X-ray transmissive membrane, as well as some random distributions in local areas.

The other processes were carried out in the same manner as in the case of Embodiment 1 to obtain a complete X-ray mask structure. Then, in a similar manner to that of Embodiment 3, patterns were formed in a resist by means of X-ray exposure. The resultant line widths were evaluated for patterns in each exposure area and the measured values were compared to the designed device line widths. The results showed that excellent coincidence with the designed value was achieved without any influence of the random variation in the thickness of the X-ray transmissive membrane of the X-ray mask structure.

Furthermore, devices were fabricated by means of X-ray exposure using the X-ray mask structure produced in such manners described above. The dimensions of obtained devices showed excellent coincidence with the designed values and these devices showed excellent device characteristics.

Example for comparison

In a similar manner to that of Embodiment 3 except that an X-ray mask structure produced by a conventional technique was used, patterns were formed in a resist on a silicon substrate by means of X-ray exposure. The X-ray mask structure was produced from an X-ray mask blank having ±10% variation in thickness of the X-ray transmissive membrane.

The resultant line widths of resist patterns were measured by a line-width-measurement SEM and the measured values were compared to the designed device line widths. The results showed 8-9% variation relative to the designed device line width. This line width variation is due to the thickness variation of the X-ray transmissive membrane of the X-ray mask structure used.

Embodiment 6

(1) Measurement of the thickness distribution of an X-ray transmissive membrane:

Prior to conversion from designed mask data to pattern data, the thickness distribution of the X-ray transmissive membrane was accurately determined across an X-ray mask blank to be used as a mask structure substrate. In this embodiment, SiN was used as the X-ray transmissive membrane. The thickness of this membrane was measured by using an optical film thickness measurement tool TM-005 (available from Canon Inc.)

(2) The change of the transferred line widths as a function of the X-ray dose:

RAY-PF (available from Hoechst) was prepared as a resist (material to which the patterns are to be transferred) to be used in the actual X-ray exposure processes. The data representing the dependence of the X-ray dose on the resist pattern line width (transferred line width) as in FIG. 5 was obtained by using a testing X-ray mask structure which was prepared in a very special manner so that there exists very little distribution in thickness of the X-ray transmissive membrane. The line widths of the resist patterns were measured by using an EB line width measurement tool. As a result of the measurement, $-74$ nm was obtained as the value of V.

(3) Measurement of resist pattern size accuracy with respect to mask size:

RAY-PF (available from Hoechst) was prepared as a resist (material to which the patterns are to be transferred) to be used in the actual X-ray exposure processes. The data representing the relationship between the mask pattern size (line width of the X-ray absorber) and the resist pattern line width (line width of the transferred pattern) formed by means of X-ray exposure was obtained by measuring these line widths, wherein the pattern transfer was performed by using a testing X-ray mask structure which was prepared in a very special manner so that there exists very little distribution in thickness of the X-ray transmissive membrane.

This evaluation process will be described in more detail. The testing X-ray mask structure used in this evaluation includes a wide range of line width such as 0.15 μm to 5.0 μm of X-ray absorber patterns formed on the X-ray transmissive membrane having little distribution in thickness. Using this testing X-ray mask structure, the resists to be used in actual processes are exposed to various X-ray doses, so as to form transferred patterns. Then, the line widths of the transferred patterns (transferred line widths) are measured and the resultant transferred line widths are plotted as a function of the line width of the X-ray absorber for each X-ray dose. From the data obtained in this way, the X-ray dose (Eop) is determined at which the transferred line widths are the same as the line widths of the X-ray absorber patterns in a range where the X-ray absorber patterns have rather large line widths (for example, 1.0 μm to 5.0 μm). Then, for this X-ray dose (Eop), the deviations of the transferred line widths from the line widths of the X-ray absorber patterns are determined which occur in a range where the X-ray absorber patterns have rather small line widths (in a hatched region in FIG. 5). Finally, these data are used to determine compensated values for the deviation from the mask size.

(4) Compensation of line widths with respect to designed values:

Based on the measurement result obtained in (1)–(3), compensation of the line widths of the X-ray absorber patterns was carried out. This compensation was done in accordance with the following steps:

1. Compensation for the thickness of the X-ray transmissive membrane: From the result obtained in (1), it was decided that X-ray absorber patterns having designed line widths of 0.5 μm and 0.2 μm were to be formed at the location (a) where the thickness of the X-ray transmissive membrane was 2 μm and that X-ray absorber patterns having designed line widths of 0.5 μm and 0.2 μm were also to be formed at the location (b) where the thickness of the X-ray transmissive membrane was 2.2 μm.

Based on the result obtained in (2), the biased values with respect to the location (a) were calculated using equation (I) for the line widths of the X-ray absorber patterns at the location (b), which were required due to the difference in the thickness of the X-ray transmissive membrane. As a result of calculation, $B = -79$ nm was obtained. In the calculation, the following values were used: $V = -74$ nm, $\Delta dm = 2 \times 10^{-5}$ cm, and $\mu = 3465$ cm$^{-1}$.

2. Compensation for the pattern size of the X-ray absorber: Based on the result obtained in (3), from the data representing the degree of the deviation of resist pattern size from the mask size corresponding to the difference in X-ray transmission due to the difference in thickness between location (a) and location (b), the biased values with respect to the location (a) were calculated. As a result of calculation, $\Delta x = -10$ nm was obtained as the biasing value for the pattern at (b) of a designed line width of 0.5 μm and $\Delta x = -0.15$ nm was obtained for the designed line width of 0.2 μm.

3. Final compensated values: In accordance with the results obtained in steps 1 and 2, the biased values for each pattern at location (b) with respect to the reference patterns at location (a) were determined from equation (II) as follows:

$-79 + (-10) = -89$ nm for 0.5 μm pattern; and
$-79 + (-15) = -94$ nm for 0.2 μm pattern.

From these results, the line widths of the X-ray absorber patterns were designed for each location on the X-ray transmissive membrane as shown below:

at location (a);
,for the designed line width (desired line width) of 0.5 μm, designed line width of the X-ray absorber is 0.5 μm;
for the designed line width (desired line width) of 0.2 μm, designed line width of the X-ray absorber is 0.2 μm;
at location (b);
for the designed line width (desired line width) of 0.5 μm, designed line width of the X-ray absorber is $0.5 - 0.089 = 0.411$ μm;
for the designed line width (desired line width) of 0.2 μm, designed line width of the X-ray absorber is $0.2 - 0.094 = 0.106$ μm.

(5) Production of an X-ray mask structure:

An X-ray mask structure was produced in accordance with the present invention as described below. First, a $25 \times 25$ mm$^2$ area of SiN on the back surface of the X-ray mask blank prepared in (1) was removed by means of dry etching in SF$_6$ gas at an RF-power of 200 W, at a pressure of 4 Pa, and at a gas flow rate of 20 sccm. Then, Si was back-etched in an aqueous solution of 25%-potassium hydroxide at 110° C. for 7 hours. After that, 5 nm-thick chromium and 50 nm-thick gold were successively deposited on the surface of the substrate by means of electron beam evaporation so as to form an electrode for plating. On this electrode, a 1 μm-thick PMMA to be used as an electron beam resist was spin-coated, then based on the design of compensated values determined in (4) electron beam exposure was carried out. After the resist was developed, using the resultant resist patterns as a template, gold-plating was performed in a sulfurous-acid-based plating solution NEWTRONEX 309 (available from EEJA) at 50° C. After the plating, the resist and gold electrode were removed by means of O$_2$ RIE and Ar sputtering, respectively. Then, the remaining Cr was oxidized by means of O$_2$ RIE so as to alter it to a transparent material for visible light. Finally, this mask structure substrate was bonded to a supporting frame of pyrex (trade name) to obtain a complete X-ray mask structure in accordance with the present invention for a positive type resist RAY-RF.

Embodiment 7

In step (2) of Embodiment 6, instead of the positive X-ray resist RAY-PF, a negative X-ray resist RAY-PN (Hoechst) was used. In a similar manner to that of Embodiment 6, the following values were obtained: $V = 32$ nm, $\Delta x = +8$ nm( for the patterns of 0.5 μm designed line width), $\Delta x = +10$ nm (for the patterns of 0.2 μm designed line width). From these values, final compensated values were obtained. That is, the biased values for each pattern at location (b) with respect to the reference patterns at location (a) were given by:

$32 + 8 = 40$ nm for the 0.5 μm pattern; and
$32 + 10 = 42$ nm for the 0.2 μm pattern.

Using other processes which are the same as those in Embodiment 1, a complete X-ray mask structure in accordance with the present invention for a positive type resist RAY-RF was obtained.

Embodiment 8

With the X-ray exposure tool shown in FIG. 8, patterns were formed in an X-ray resist on a Si substrate by means of X-ray exposure using the X-ray mask structure produced by the method described in Embodiment 6 or 7. The line widths of the formed resist patterns were measured by means of a line-width-measurement SEM and the measured values were compared to the designed device values. The result showed that the patterns were formed faithfully to the designed device values without influence of the thickness distribution of the X-ray transmissive membrane of the X-ray mask structure regardless of the line width distribution of the X-ray absorber patterns.

Furthermore, devices were fabricated by means of X-ray exposure using the X-ray mask structure produced in such manners described above. The obtained device patterns showed excellent coincidence with the designed device patterns. As a result, these devices showed excellent device characteristics. In addition, it is possible to achieve high integration density because of the advantageous features of the X-ray lithography.

Embodiment 9

Figure 9:
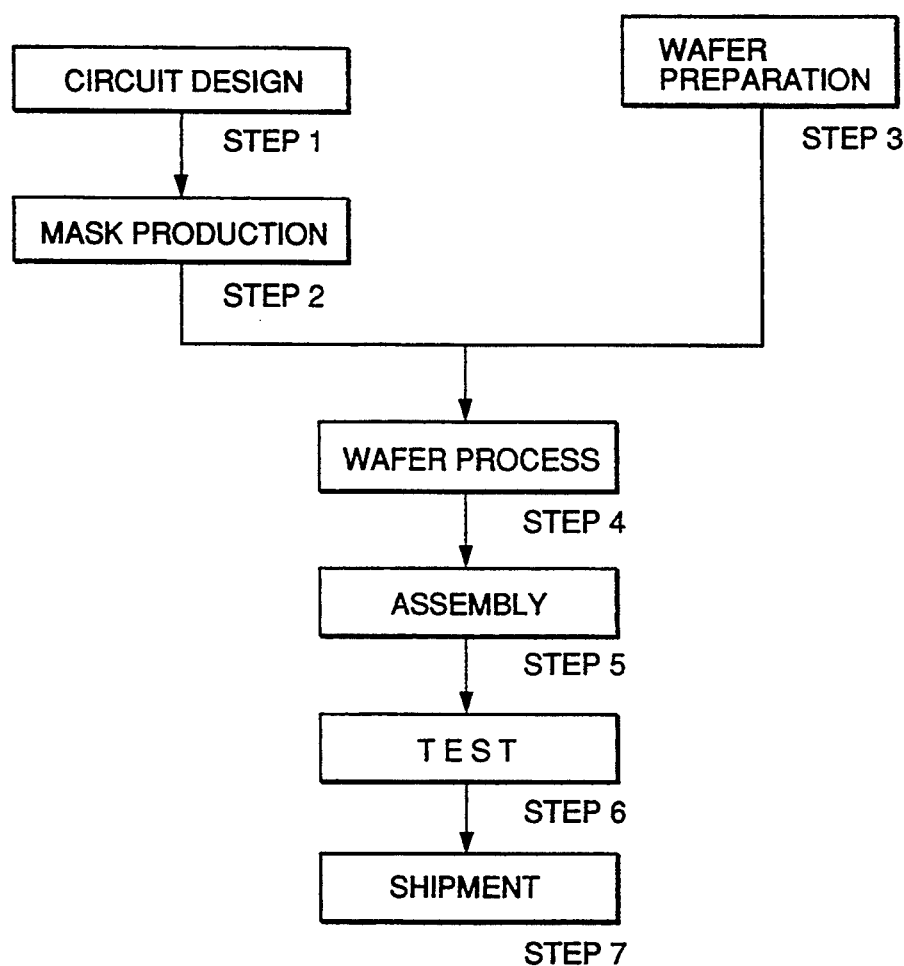
FIG. 9 is a flowchart showing processes for fabricating a semiconductor device.

Now, hereinbelow will be described an example of a fabrication method of a device using an X-ray mask having a structure as discussed above. FIG. 9 is a flowchart showing fabrication processes of a device (for example, a semiconductor chip such as IC and LSI, a liquid-crystal display panel, a CCD, etc.). In step 1 (circuit design), circuit design is carried out for the semiconductor device. In step 2 (mask production), an X-ray mask structure is produced which includes circuit patterns of the designed circuit. In parallel to these steps, in step 3 (wafer preparation), a wafer is produced from a silicon material or the like. In step 4 (wafer process), using the X-ray mask structure and the wafer prepared in the above steps, an actual circuit is formed on the wafer by means of lithography technology. In the next step 5 (assembly), the wafer fabricated in step 4 is divided into individual chips which are further assembled. This step includes dicing, bonding, and packaging (sealing of the chip). In step 6 (testing), the semiconductor devices fabricated in step 5 are subjected to the evaluation such as operation test and reliability test. After these steps, the semiconductor devices are completed and shipped (step 7).

Figure 10:
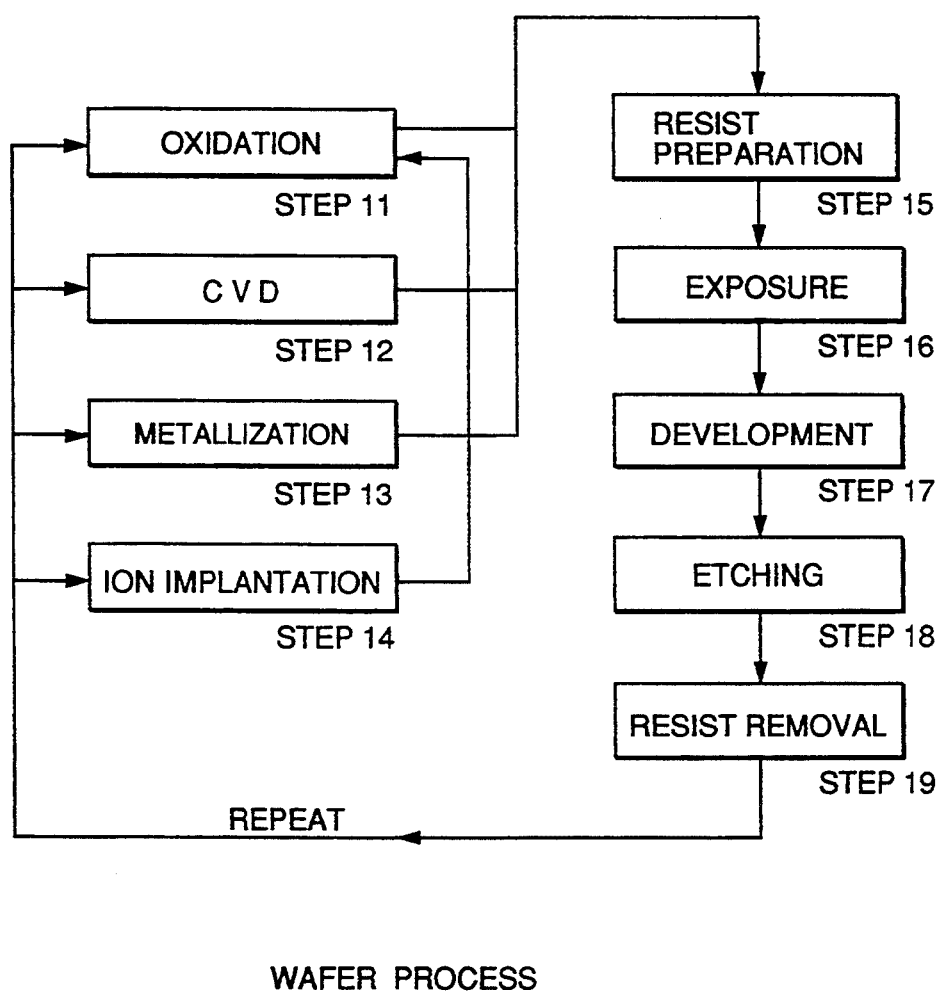
FIG. 10 is a flowchart showing a wafer process.

FIG. 10 is a flowchart showing a wafer process in more detail. In step 11 (oxidation), the surface of the wafer is oxidized. In step 12 (CVD), an insulating film is formed on the surface of the wafer. Then, in step 13 (metallization), electrodes are formed on the surface of the wafer by means of successive evaporation. In step 14 (ion implantation), ions are implanted into the wafer. In step 15 (resist preparation), an X-ray sensitive material (resist) is coated on the wafer. Then, in step 16 (exposure), exposure of the circuit pattern of the mask is performed on the wafer by the exposure methods discussed above. In step 17 (development), the exposed wafer is developed. In step 18 (etching), the portions except for the resist image formed by the development are etched. In step 19 (resist removal), the remaining resist, which became unnecessary after the etching process, is removed. By repeating these steps, multi-level circuit patterns are formed on the wafer.

The fabrication method in accordance with the present invention enables the production of high-integration density semiconductor devices which are difficult to produce by conventional fabrication technologies.

What is claimed is:

1. An X-ray mask structure comprising:
   X-ray absorbers;
   an X-ray transmissive membrane for supporting said X-ray absorbers; and
   a supporting frame for supporting said X-ray transmissive membrane, wherein line widths of said X-ray absorbers are compensated for by a compensation amount corresponding to a thickness distribution of said X-ray transmissive membrane, to cancel deviation of line widths of transferred patterns from desired line widths of the patterns.

2. An X-ray mask structure as defined in claim 1, wherein the compensation amount (B) of the line widths of said X-ray absorbers satisfies a relationship represented by the following equation (I):

$$|B| = |V \cdot exp(\mu \cdot \Delta dm)| \quad (I)$$

where $\mu$ (cm$^{-1}$) is the linear absorption coefficient of the X-ray transmissive membrane with respect to incident X-rays, $\Delta dm$ (nm) is the variation in the thickness of the X-ray transmissive membrane, and V (nm) is the change in the transferred line width due to the change of unit X-ray dose.

3. An X-ray mask structure as defined in claim 2, wherein the value of V in said equation (I) is in a range from $-100$ to $+100$.

4. An X-ray mask structure as defined in claim 1, wherein the line widths of said X-ray absorbers are further compensated for by another compensation amount corresponding to the line width variation of said X-ray absorbers, to cancel the deviation of the line widths of transferred patterns from the desired line widths of the patterns.

5. An X-ray mask structure as defined in claim 4, wherein the compensation amount (B) of the line widths of said X-ray absorbers satisfies a relationship represented by the following equation (II):

$$|B| = |V \cdot exp(\mu \cdot \Delta dm) + \Delta x| \quad (II)$$

where $\mu$ (cm$^{-1}$) is the linear absorption coefficient of the X-ray transmissive membrane with respect to incident rays, $\Delta dm$ (nm) is the variation in the thickness of the X-ray transmissive membrane, V (nm) is the change in the transferred line width due to the change of unit X-ray dose, and $\Delta x$ (nm) is the deviation of the line width of the transferred pattern which occurs depending on the variation of the line width of the X-ray absorber.

6. An X-ray mask structure as defined in claim 5, wherein the value of V in said equation (II) is in a range from $-100$ to $+100$.

7. An X-ray mask structure as defined in claim 1, wherein the thickness of said X-ray transmissive membrane is in a range from 1 $\mu$m to 10 $\mu$m.

8. An exposure method for transferring a pattern of X-ray absorbers to a material to which the pattern is to be transferred by means of X-ray exposure, said method comprising the steps of:
   providing an X-ray mask structure comprising:
   (i) X-ray absorbers;
   (ii) an X-ray transmissive membrane for supporting the X-ray absorbers; and
   (iii) a supporting frame for supporting the X-ray transmissive membrane, wherein line widths of the X-ray absorbers are compensated for by a compensation amount corresponding to a thickness distribution of the X-ray transmissive membrane, to cancel deviation of line widths of transferred patterns from desired line widths of the patterns; and
   transferring a pattern of the X-ray absorbers of the X-ray mask structure to a material to which the pattern is to be transferred, by using X-ray exposure.

9. A device fabricated by a method comprising the steps of:
   providing an X-ray mask structure comprising:
   (i) X-ray absorbers;
   (ii) an X-ray transmissive membrane for supporting the X-ray absorbers;
   (iii) a supporting frame for supporting the X-ray transmissive membrane, wherein line widths of the X-ray absorbers are compensated for by a compensation amount corresponding to a thickness distribution of the X-ray transmissive membrane, to cancel deviation of line widths of transferred patterns from desired line widths of the patterns; and
   transferring a pattern of the X-ray absorbers onto a substrate to be fabricated by using X-ray exposure.

10. A method for producing an X-ray mask structure comprising X-ray absorbers, an X-ray transmissive membrane for supporting the X-ray absorbers, and a supporting frame for supporting the X-ray transmissive membrane, said method comprising the steps of:
    measuring the thickness distribution of the X-ray transmissive membrane; and
    compensating for line widths of the X-ray absorbers, on the basis of the thickness distribution of the X-ray transmissive membrane measured in said measuring step, to cancel deviation of line widths of transferred patterns from desired line widths of the patterns.

11. A method for producing an X-ray mask structure comprising X-ray absorbers, an X-ray transmissive membrane for supporting the X-ray absorbers, and a supporting frame for supporting the X-ray transmissive membrane, said method comprising the steps of:
    measuring the thickness distribution of the X-ray transmissive membrane;
    measuring transferred line widths corresponding to a variation of line width of the X-ray absorbers; and
    compensating for the line widths of the X-ray absorbers, on the basis of the thickness distribution of the X-ray transmissive membrane and the transferred line widths measured in said measuring steps, to cancel deviation of the line widths of the transferred patterns from desired line widths of the patterns.

* * * * *

UNITED STATES PATENT AND TRADEMARK OFFICE
CERTIFICATE OF CORRECTION

PATENT NO. : 5,375,157  
DATED : December 20, 1994  
INVENTOR(S) : Hiroshi MAEHARA Page 1 of 2

It is certified that error appears in the above-indentified patent and that said Letters Patent is hereby corrected as shown below:

ON THE COVER PAGE:

IN THE ABSTRACT:

Line 1, "structure" should read --structure,--; and
Line 7, "means the" should read --means of the--.

COLUMN 3:

Line 41, "structures" should read --structure--; and
Line 42, "sections" should read --section--.

COLUMN 4:

Line 17, "in" (first occurrence) should read --In--.

COLUMN 9:

Line 13, "(4) production" should read
--(4) Production--.

COLUMN 10:

Line 49, "20 °C." should read --120 °C.--; and
Line 53, "water" should read --water)--.

UNITED STATES PATENT AND TRADEMARK OFFICE
CERTIFICATE OF CORRECTION

PATENT NO. : 5,375,157
DATED : December 20, 1994
INVENTOR(S) : Hiroshi MAEHARA

It is certified that error appears in the above-indentified patent and that said Letters Patent is hereby corrected as shown below:

COLUMN 12:

Line 63, "and$\mu$=3465" should read --and $\mu$=3465--.

COLUMN 13:

Line 19, ", for" should read --for--; and
Line 35, "mm$^{22}$" should read --mm$^2$--.

Signed and Sealed this

Twenty-third Day of May, 1995

Attest:

BRUCE LEHMAN

Attesting Officer    Commissioner of Patents and Trademarks